United States Patent
Kim et al.

(10) Patent No.: US 10,283,654 B2
(45) Date of Patent: May 7, 2019

(54) METHOD OF MANUFACTURING CIGS-BASED SOLAR CELL AND CIGS-BASED SOLAR CELL

(71) Applicant: KOREA INSTITUTE OF ENERGY RESEARCH, Daejeon (KR)

(72) Inventors: Kihwan Kim, Daejeon (KR); Jae-ho Yun, Daejeon (KR); Jihye Gwak, Daejeon (KR); Seung-kyu Ahn, Daejeon (KR); Jun-Sik Cho, Daejeon (KR); Joo-hyung Park, Daejeon (KR); Young-Joo Eo, Daejeon (KR); Jin-su Yoo, Daejeon (KR); Se-jin Ahn, Daejeon (KR); Ara Cho, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 164 days.

(21) Appl. No.: 15/363,764

(22) Filed: Nov. 29, 2016

(65) Prior Publication Data
US 2018/0138336 A1    May 17, 2018

(30) Foreign Application Priority Data
Nov. 17, 2016 (KR) .......... 10-2016-0153512

(51) Int. Cl.
*H01L 31/0224* (2006.01)
*H01L 31/18* (2006.01)
(Continued)

(52) U.S. Cl.
CPC ........... *H01L 31/022441* (2013.01); *H01L 31/022466* (2013.01); *H01L 31/022475* (2013.01);
(Continued)

(58) Field of Classification Search
CPC ......... H01L 31/022441; H01L 31/0322; H01L 31/1884; H01L 31/022483; H01L 31/0687; H01L 31/022475; Y02E 10/544
See application file for complete search history.

(56) References Cited

U.S. PATENT DOCUMENTS

2010/0068623 A1    3/2010  Braun et al.
2012/0273915 A1*  11/2012  Wang ............... H01L 31/02249
                                                    257/458

FOREIGN PATENT DOCUMENTS

CN      105225728 A  *  1/2016  .............. H01B 5/14
JP      5475246 B2      4/2014
(Continued)

OTHER PUBLICATIONS

Takado, "Semi-transparent Cu(In/sub 1-x/,Ga/sub x/)Se/sub 2/ thin film solar cells using an indium tin oxide back electrode" IEEE 2003.*

*Primary Examiner* — Matthew T Martin
(74) *Attorney, Agent, or Firm* — Sughrue Mion, PLLC

(57) ABSTRACT

A method of manufacturing a CIGS-based solar cell including a transparent rear electrode, the method comprising forming a rear electrode layer including a transparent oxide material; forming rear electrode patterns including a metal material on the rear electrode layer; forming a CIGS-based light absorption layer on the rear electrode layer on which the rear electrode patterns are formed; forming a buffer layer on the light absorption layer; and forming a front electrode including a transparent material on the buffer layer, wherein the rear electrode patterns are provided with a transmissive portion, through which light is transmitted, formed between patterns of the metal material.

4 Claims, 11 Drawing Sheets

(51) Int. Cl.
*H01L 31/032* (2006.01)
*H01L 31/0687* (2012.01)
*H01L 31/0392* (2006.01)
*H01L 31/054* (2014.01)

(52) U.S. Cl.
CPC .. *H01L 31/022483* (2013.01); *H01L 31/0322* (2013.01); *H01L 31/03923* (2013.01); *H01L 31/0543* (2014.12); *H01L 31/0547* (2014.12); *H01L 31/0687* (2013.01); *H01L 31/1884* (2013.01); *Y02E 10/544* (2013.01); *Y02P 70/521* (2015.11)

(56) References Cited

FOREIGN PATENT DOCUMENTS

| | | |
|---|---|---|
| KR | 100812671 B1 | 3/2008 |
| KR | 1020140001729 A | 1/2014 |
| KR | 10-1497955 B1 | 3/2015 |

* cited by examiner

METHOD OF MANUFACTURING CIGS-BASED SOLAR CELL AND CIGS-BASED SOLAR CELL

CROSS-REFERENCE TO RELATED APPLICATION

This application claims the priority benefit of Korean Patent Application No. 10-2016-0153512, filed on Nov. 17, 2016 in the Korean Intellectual Property Office, the disclosure of which is incorporated herein by reference.

BACKGROUND OF THE INVENTION

1. Field of the Invention

The present invention relates to a method of manufacturing a CGIS-based solar cell and a CIGS-based solar cell, and more particularly to a CIGS-based solar cell which uses light incident on a lower part thereof, thereby being applicable to a double-sided solar module or a tandem solar module, and a method of manufacturing the same.

2. Description of the Related Art

Recently, the importance of the development of next-generation clean energy sources has increased due to serious environmental pollution and the depletion of fossil fuels. A solar cell is a device that directly converts solar energy into electric energy. The solar cell incurs insignificant pollution, includes a material obtained from an infinite resource, and has a semipermanent life span, and accordingly, the solar cell is expected to be an energy source that solves future energy problems.

The solar cell is classified into various types depending on the material that is used in a light-absorption layer thereof. Currently, the most frequently used solar cell is a silicon solar cell using silicon. However, there is growing interest in a thin-film solar cell due to the currently rapidly increasing cost of silicon, attributable to the short supply thereof. Since the thin-film solar cell is manufactured to be slim, a small amount of material is used, and the application range thereof is extensive due to its low weight. Examples of material used in practice, among the materials of the thin-film solar cell, include CdTe. Recently, CIGS (copper indium gallium selenide), having a high light-absorption coefficient, has come into the spotlight.

Meanwhile, a solar cell, which is the basic unit of the solar module, generally generates electric power using light that is incident on a front electrode, through which light can be transmitted. A rear electrode includes a metal material through which light cannot be transmitted. However, recent solar module has been constituted so that light is transmissible through both front and rear sides of the module in order to attach a thin-film solar module to a window or in order to use light that is incident on the rear side of the solar module. Alternatively, solar module technologies adopting a rear electrode, through which light is transmitted, have been developed for application to the upper cell of a tandem solar module including multiple layers of solar cells, thereby effectively using light having various wavelengths.

However, a TCO material, which is most frequently used as a transparent electrode in recent years, has a drawback in that, since the TCO material is reacted with Ga contained in CIGS to form $Ga_2O_3$, the specific resistance of a CIGS-based solar cell including a transparent rear electrode is increased, thus greatly reducing the efficiency of the solar cell. Furthermore, when a CIGS layer is formed in order to prevent the formation of $Ga_2O_3$, which is considered to be a problem, a process for forming the CIGS layer is limitative, thus reducing the efficiency of the solar cell.

Accordingly, there is a continuing need for a CIGS-based solar cell, which prevents a reduction in efficiency caused by the formation of $Ga_2O_3$ even though the CIGS-based solar cell includes a transparent rear electrode including a low-priced TCO material, and for a method of manufacturing the same.

SUMMARY OF THE INVENTION

Accordingly, the present invention has been made keeping in mind the above problems occurring in the related art, and an object of the present invention is to provide a CIGS-based solar cell, which prevents a reduction in efficiency caused by the formation of $Ga_2O_3$ even though the CIGS-based solar cell includes a transparent rear electrode including a TCO material, and a method of manufacturing the same.

In order to accomplish the above object, the present invention provides a method of manufacturing a CIGS-based solar cell, the method including forming a rear electrode layer including a transparent oxide material, forming rear electrode patterns including a metal material on the rear electrode layer, forming a CIGS-based light absorption layer on the rear electrode layer on which the rear electrode patterns are formed, forming a buffer layer on the light absorption layer, and forming a front electrode including a transparent material on the buffer layer. A transmissive portion, through which light is transmitted, is formed between the rear electrode patterns including the metal material.

In the method of manufacturing the CIGS-based solar cell according to the present invention, the metal rear electrode patterns provided with the light-transmissive portion are formed on the surface of the rear electrode layer including the TCO material, thus reducing the amount of $Ga_2O_3$ formed between the rear electrode layer and the light absorption layer. Even though $Ga_2O_3$ is formed, since current flows through the rear electrode patterns, the interfacial resistance between the rear electrode layer and the light absorption layer is prevented from being increased. Thus, even though the rear electrode including the TCO material is used, the photoelectric conversion efficiency of the solar cell is maintained.

It is preferable that the forming the rear electrode patterns include attaching spherical particles to the surface of the rear electrode layer so that the spherical particles are arranged close together, depositing the metal material between the spherical particles, which are arranged close together, and removing the spherical particles.

The portion that is occupied by the spherical particles becomes the light-transmissive portion. Metal is deposited only between the spherical particles, thus forming the rear electrode patterns.

In the case where the rear electrode patterns are formed using the above-described method, when the spherical particles are selected, the particle size may be controlled so as to control the size of the rear electrode patterns. Specifically, the width of the pattern and the size of the light-transmissive portion, which is the interval between the patterns, are increased as the size of the selected spherical particle is increased. Conversely, the width of the pattern and the size of the light-transmissive portion are reduced as the size of the spherical particle is reduced.

Alternatively, after the attaching the spherical particles, the size of the spherical particle may be controlled to thus control the size of the rear electrode pattern. When the surface of the spherical particle is etched after the attaching the spherical particles to reduce the volume of the spherical particle, the width of the pattern is increased but the size of the light-transmissive portion, which is the interval between the patterns, is reduced. In addition, when the spherical particles are stuck together after the attaching the spherical particles, the width of the pattern is reduced but the area occupied by the light-transmissive portions per unit area of the rear electrode layer is increased.

When the spherical particles include a polystyrene material, the spherical particles may be attached and then immersed in an organic solvent such as acetone to be stuck together and highly densified, and thus the area occupied by the spherical particles per unit area of the rear electrode layer may be increased.

In order to accomplish the above object, the present invention also provides a CIGS-based solar cell including a rear electrode layer including a transparent conductive oxide material, rear electrode patterns which include a metal material and which are formed on the surface of the rear electrode layer, a CIGS-based light absorption layer formed on the rear electrode patterns, a buffer layer formed on the light absorption layer, and a front electrode which includes a transparent material and which is formed on the buffer layer. A transmissive portion, through which light is transmitted, is formed between the rear electrode patterns including the metal material, and the light absorption layer is in contact with the portion of the rear electrode layer that is exposed through the transmissive portion.

Since the width of the rear electrode pattern and the interval between the rear electrode patterns affect the transmission of light, the area of the rear electrode patterns may be controlled within the range of 5 to 10% of the gross area of the rear electrode layer, and the height of the rear electrode pattern is preferably in the range of 5 to 100 nm.

It is preferable that the material of the rear electrode pattern be Mo, and it is preferable that the material of the rear electrode layer be any one of ITO, ZnO, and doped ZnO.

In order to accomplish the above object, the present invention also provides a tandem solar module, in which two or more solar cells are layered. The tandem solar module includes the one or more CIGS-based solar cells having the above-described structure. The CIGS-based solar cell having the double-sided transmission structure according to the present invention may be applied to an upper cell in the case where light is intended to be incident from the upper cell onto a lower cell positioned beneath the upper cell. Further, the CIGS-based solar cell having the double-sided transmission structure according to the present invention may be applied to the bottom cell, which is positioned on the lowermost side, thereby constituting a double-sided transmission tandem solar module.

According to the present invention having the above-described constitution, the metal rear electrode patterns provided with the light-transmissive portion are formed on the surface of the rear electrode layer including the TCO material, thus reducing the amount of $Ga_2O_3$ formed between the rear electrode layer and the light absorption layer. Even though $Ga_2O_3$ is formed, since current flows through the rear electrode patterns, the interfacial resistance between the rear electrode layer and the light absorption layer is prevented from being increased. Thus, even though the rear electrode including the TCO material is used, the photoelectric conversion efficiency of the solar cell is maintained.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
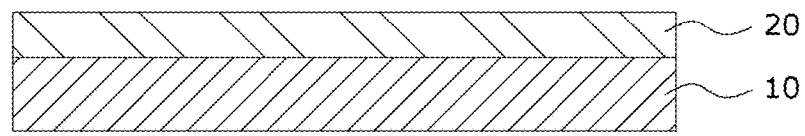
FIGS. 1 to 4 are views showing a process for manufacturing a double-sided transmission CIGS solar cell according to an embodiment of the present invention.
Figure 2:
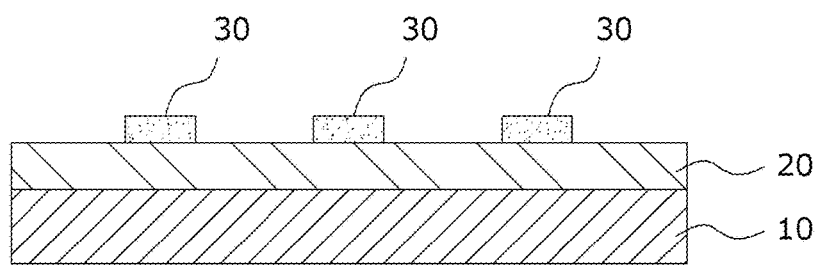
Figure 3:
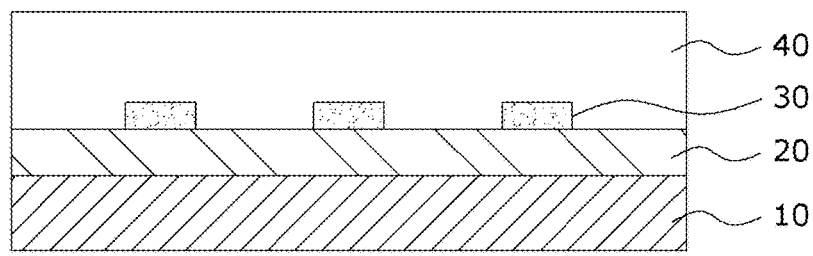
Figure 4:
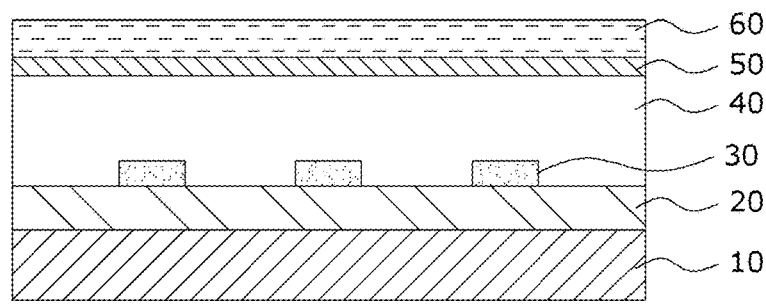

A detailed description will be given of embodiments of the present invention, with reference to the appended drawings.

The structure and the manufacture of a double-sided transmission CIGS solar cell of the present invention will be described using the embodiments below.

FIGS. 1 to 4 are views showing a process for manufacturing the double-sided transmission CIGS solar cell according to the embodiment of the present invention.

In the present embodiment, first, a rear electrode layer 20 including a TCO material is formed on the surface of a transparent substrate 10.

Representative examples of the transparent substrate 10 may include a glass substrate including a soda lime glass material but are not limited thereto, and various transparent materials may be applied to the substrate.

The rear electrode layer 20 includes a transparent TCO (transparent conducting oxide) material so that light is transmitted through a lower part thereof, unlike the related art, in which a Mo electrode layer is used for the purpose of increasing the efficiency of the CIGS solar cell. An ITO (indium tin oxide) material, which has been most frequently used as a transparent electrode material, may be applied to the rear electrode layer. Further, a TCO material such as ZnO may be used.

In the case where only the rear electrode layer 20 including the TCO material is provided, when a CIGS layer is formed as a light absorption layer, oxygen contained in the rear electrode layer 20 reacts with Ga, generated during the formation of CIGS, thus forming $Ga_2O_3$ at the interface with the rear electrode layer 20. Accordingly, the specific resistance is increased.

Therefore, in the present embodiment, rear electrode patterns 30 including a molybdenum material are formed on the surface of the rear electrode layer 20. A light-transmissive portion, through which light may be transmitted, is provided between the rear electrode patterns 30. Accordingly, even though the rear electrode patterns 30 include an opaque material, the light that passes through the rear electrode layer 20 of the solar cell, may be incident on the light absorption layer through the light-transmissive portion.

When the width of the rear electrode pattern 30 is very large or the interval between the rear electrode patterns 30 is very narrow, the area of the rear electrode patterns 30 may be excessively increased, thus greatly reducing the quantity of light that is transmitted. Accordingly, it is preferable to control the width of the rear electrode pattern and the interval between the rear electrode patterns so that the area of the rear electrode patterns is in the range of 5 to 10% of the gross area of the rear electrode layer. Further, the height of the rear electrode pattern 30 (hereinafter, referred to as thickness) is not particularly limited. However, since the thickness of the CIGS layer is increased when the thickness of the rear electrode pattern 30 is increased, it is preferable for the thickness to be in the range of 5 to 100 nm.

The method for forming the rear electrode patterns 30 provided with the light-transmissive portion is not particularly limited, but various methods may be applied. However, the forming method must be selected in consideration of the thickness of the pattern, the interval between the patterns, and processing costs. The method of forming the rear electrode pattern in consideration of processing costs, the thickness of the pattern and the interval between the patterns will be described in detail below.

A CIGS layer 40 is formed on the portion of the surface of the rear electrode layer 20 that is exposed through the light-transmissive portion provided between the rear electrode patterns 30 and the rear electrode patterns 30.

In the present embodiment, the rear electrode pattern 30 may be formed in advance to thus prevent $Ga_2O_3$ from being formed at the interface between the rear electrode layer 20, including the TCO material, and the CIGS layer 40. Even though $Ga_2O_3$ is formed, the interface between the rear electrode pattern 30 and the CIGS layer 40 may be maintained to thus act as an appropriate current-carrying path, thereby preventing a reduction in efficiency caused by increased resistance. Therefore, conventionally known methods for forming the CIGS layer may be applied, but without limitation thereto. Particularly, there is a merit in that methods involving increasing the temperature of the substrate to 500° C. or higher can be applied.

A buffer layer 50 and a front electrode 60 including a transparent material are formed on the CIGS layer 40, thereby manufacturing a CIGS solar cell.

The buffer layer 50 and the front electrode 60 may have the same constitution as that applied to a conventional CIGS solar cell, without limitation thereto, and accordingly, a detailed description thereof will be omitted.

In the double-sided transmission CIGS solar cell of the present invention, manufactured using the above-described method, the rear electrode patterns 30 provided with the light-transmissive portion are formed on the surface of the rear electrode layer 20 including the TCO material, and then the CIGS layer 40 is formed. Accordingly, since the oxygen contained in the rear electrode layer 20 does not react with the Ga contained in the CIGS layer 40, the performance of the solar cell is improved. Further, since light is transmitted through the light-transmissive portion formed between the rear electrode patterns 30, the light transmitted from the lower part may be used, thereby increasing photoelectric conversion efficiency.

Meanwhile, in the above description, the solar cell of the present invention is applicable to a double-sided transmission solar module having a monolayer. However, the present invention is not limited to the monolayer structure. When the solar cell of the present invention is applied to the upper cell of a tandem solar module in which light is intended to be incident from the front side to the lower cell, the efficiency of the upper cell may be improved, thereby providing a tandem solar module having improved efficiency. Here, the upper cell refers to any cells that are to transmit light to a lower cell. Further, the solar cell of the present invention may be applied to the bottom cell, which is positioned on the lowermost side, as well as the upper cell, thereby constituting a double-sided transmission tandem solar module. In the case where the solar cell of the present invention is applied to the tandem solar module, all conventional structures and manufacturing methods of the tandem solar module may be applied, except that the rear electrode patterns provided with the light transmission layer are formed on the surface of the rear electrode layer. Accordingly, a detailed description thereof will be omitted.

Hereinafter, the formation of the rear electrode pattern during a process for manufacturing the double-sided solar cell according to the present invention will be described in detail.

Figure 5:
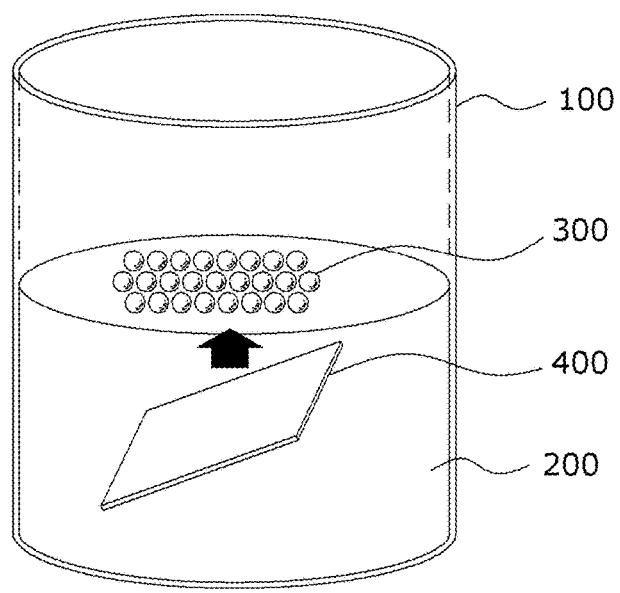
FIGS. 5 to 7 are mimetic views showing the formation of a rear electrode pattern during the process for manufacturing the double-sided solar cell according to the embodiment of the present invention.
Figure 6:
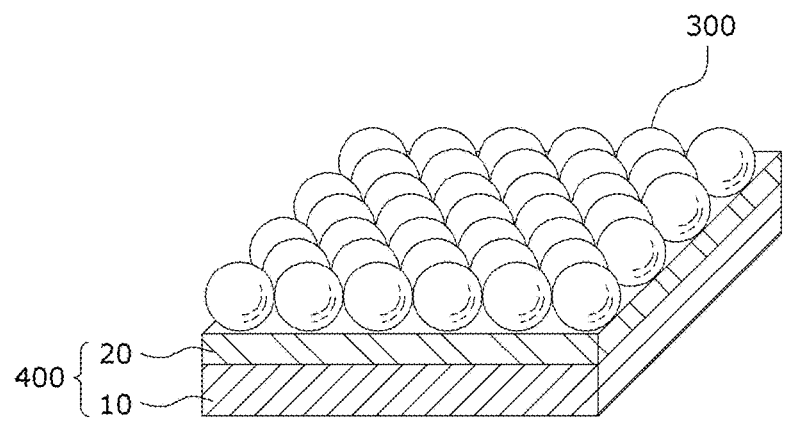
Figure 7:
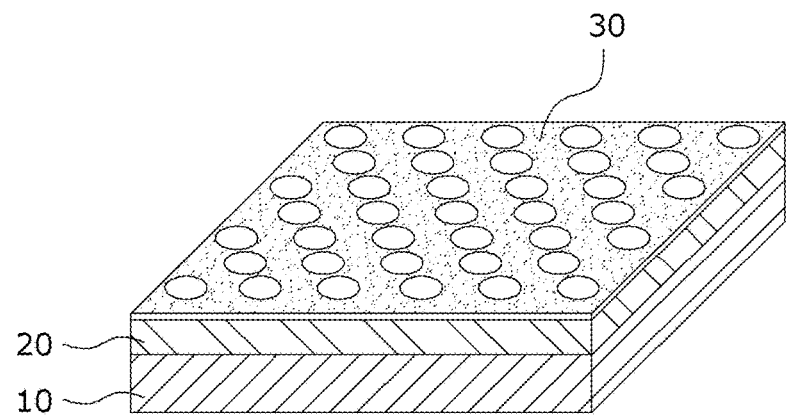

FIGS. 5 to 7 are mimetic views showing the formation of the rear electrode pattern during the process for manufacturing the double-sided solar cell according to the embodiment of the present invention.

First, a monolayer including polystyrene spheres 300 having an average diameter of 1 μm is attached to the surface of a substrate 400 including the transparent substrate 10 and the rear electrode layer 20, which includes the TCO material and which is formed on the surface of the transparent substrate 10.

Specifically, as shown in FIG. 5, a water tank 100 is filled with water 200, and the polystyrene spheres 300 are added thereto. While the polystyrene spheres 300 float in water 200, the substrate 400 is drawn upward to thus attach the monolayer of the polystyrene spheres 300 to the surface of the substrate 400. As shown in FIG. 6, the polystyrene spheres 300 are arranged close together on the surface of the substrate 400.

In addition, when the surface of the rear electrode layer 20, on which the polystyrene spheres 300 are arranged in a monolayer, is coated with Mo, as shown in FIG. 7, Mo is applied only to the area between the polystyrene spheres 300 to thus form the rear electrode patterns 30. However, Mo is not applied to portions of the surface of the rear electrode layer 20 that are in contact with the polystyrene spheres 300, thereby forming a light-transmissive portion through which the rear electrode layer 20 is partially exposed. Various methods may be used to apply Mo, without limitation thereto. Electroplating and electroless plating processes may be applied, and an electron beam vacuum evaporation process or sputtering is also feasible.

Figure 8:
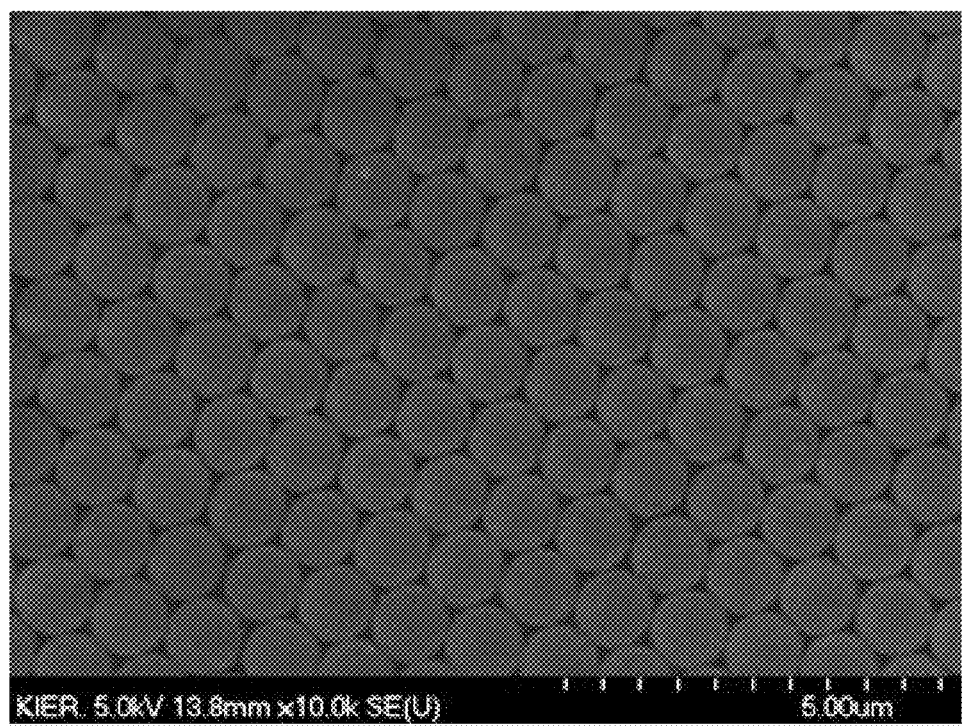
FIG. 8 is an electron micrograph showing a monolayer including polystyrene spheres attached during the formation of the rear electrode pattern according to the embodiment of the present invention.
Figure 9:
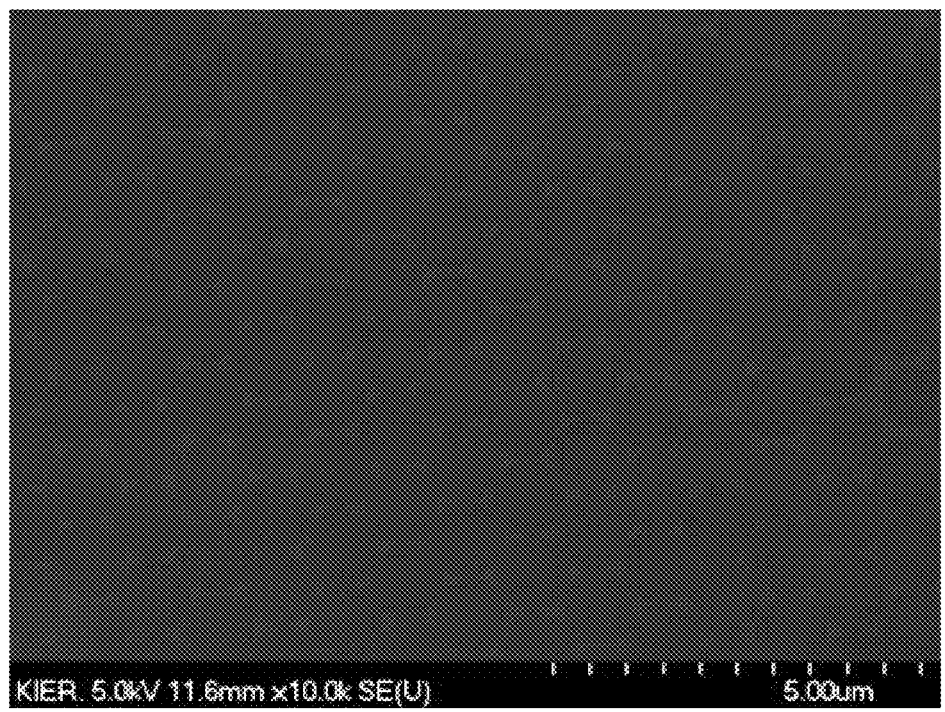
FIGS. 9 and 10 are electron micrographs showing that the rear electrode pattern is formed between the polystyrene spheres.
Figure 10:
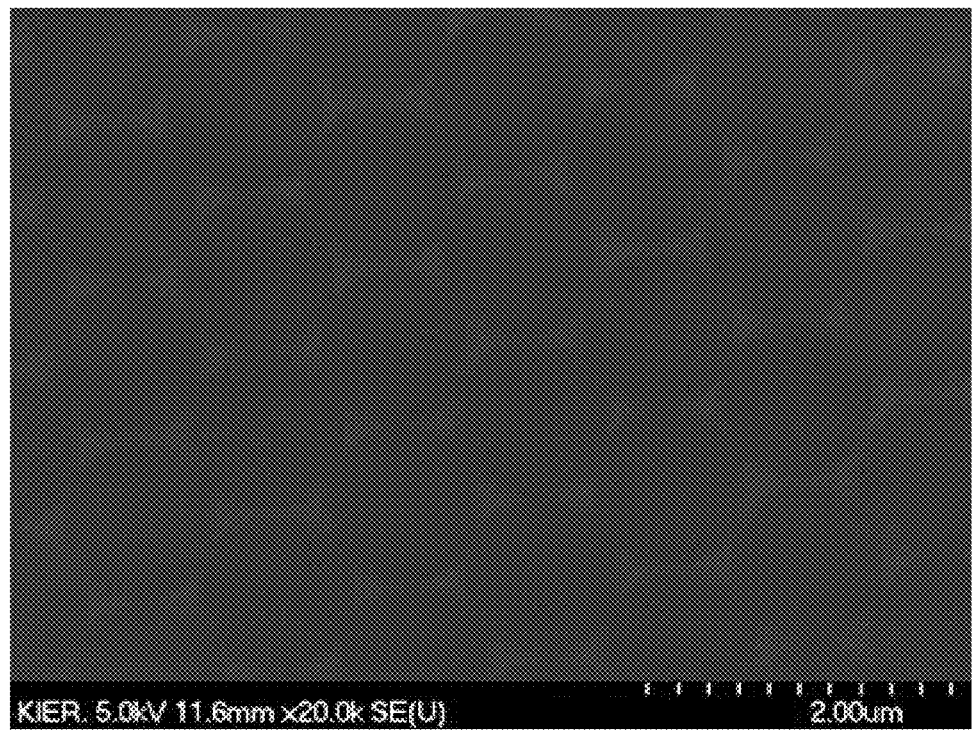

FIG. 8 is an electron micrograph showing a monolayer of polystyrene spheres attached during the formation of the rear electrode pattern according to the embodiment of the present invention. FIGS. 9 and 10 are electron micrographs showing the formation of the rear electrode pattern.

From FIG. 8, it can be confirmed that the polystyrene spheres are attached and arranged close together in a monolayer. In FIGS. 9 and 10, a dark portion represents a portion through which the rear electrode layer is exposed, and also represents a light-transmissive portion allowing light to be transmitted through the lower side thereof. In the pictures, a bright portion represents the rear electrode patterns formed by plating Mo. FIG. 10 is a picture having a magnification that is higher than that of FIG. 9. From the picture, it can be confirmed that the rear electrode patterns are formed by plating Mo on portions other than the portion to which the polystyrene spheres are attached.

Next, a method for controlling the width of the pattern and the interval between the patterns during the formation of the rear electrode patterns will be described.

FIGS. 11 to 14 are mimetic views showing that the shape of the rear electrode pattern depends on the size of the polystyrene sphere during the formation of the rear electrode pattern according to the embodiment of the present invention.

Figure 11:
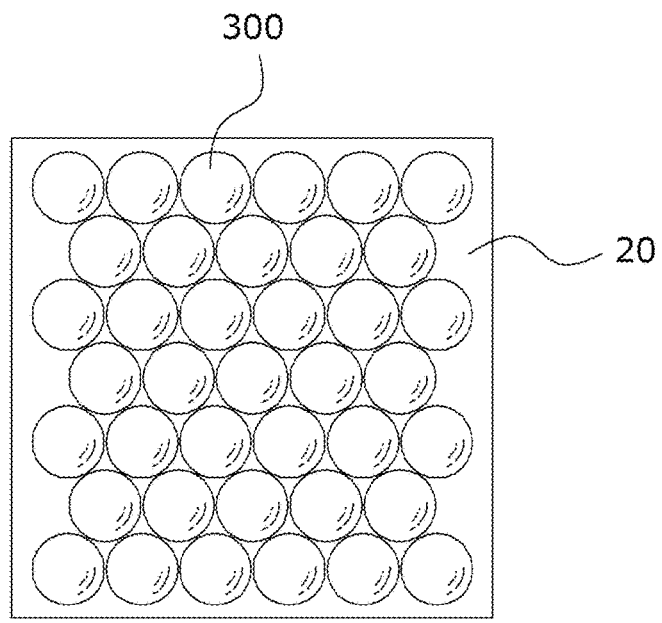
FIGS. 11 to 14 are mimetic views showing that the shape of the rear electrode pattern depends on the size of the polystyrene sphere during the formation of the rear electrode pattern according to the embodiment of the present invention.
Figure 12:
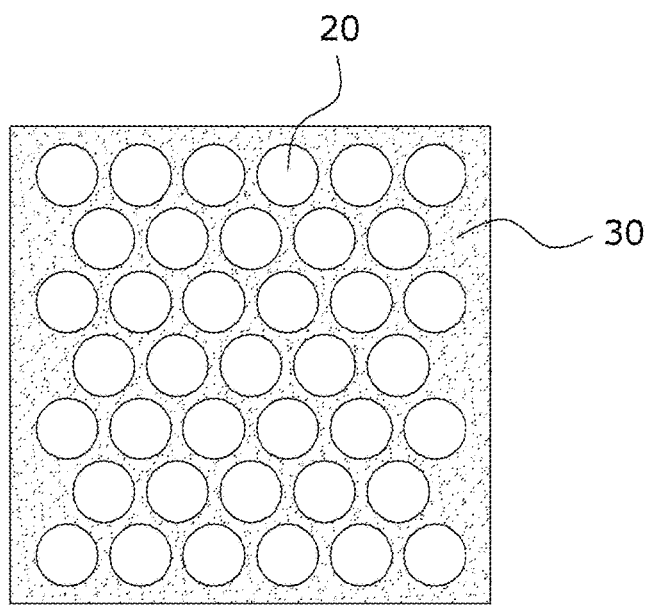
Figure 13:
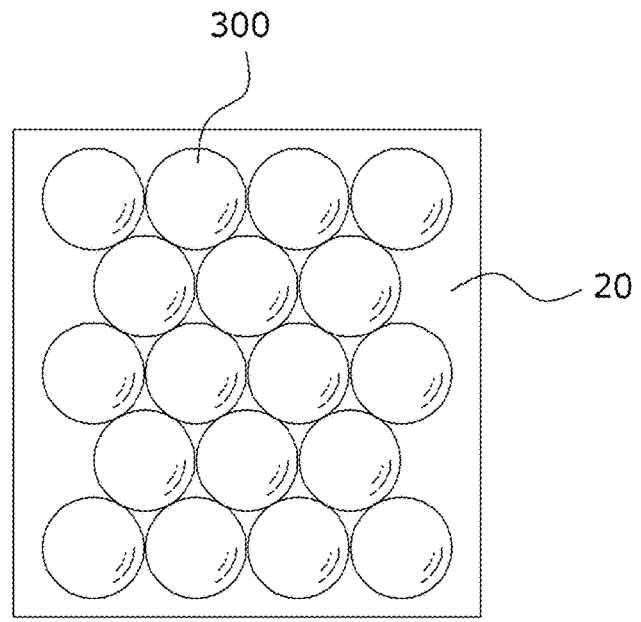
Figure 14:
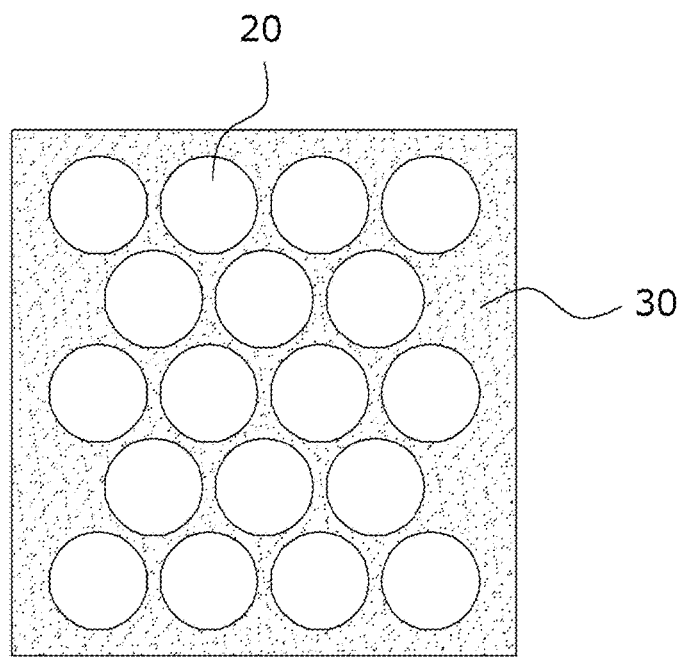

As shown in FIGS. 11 and 13, the shape of the rear electrode pattern may be controlled by changing the size of the polystyrene sphere 300 attached to the rear electrode layer 20. FIG. 13 shows polystyrene spheres 300 having an average diameter that is larger than that of the polystyrene spheres of FIG. 11. As shown in FIGS. 12 and 14, the shape of the rear electrode pattern 30 depends on the size of the polystyrene sphere 300. Particularly, the size of the transmissive portion, which is positioned between the rear electrode patterns 30 and through which the rear electrode layer 20 is exposed, is increased as the size of the polystyrene sphere 300 is increased. However, when the size of the polystyrene sphere 300 is increased, the space between the attached polystyrene spheres 300 is enlarged, and accordingly, the width of the rear electrode pattern 30 may be increased.

FIGS. 15 to 18 are mimetic views showing a method for controlling the size of the polystyrene spheres, which are attached to the substrate during the formation of the rear electrode pattern according to the embodiment of the present invention, thereby controlling the shape of the rear electrode pattern.

Figure 15:
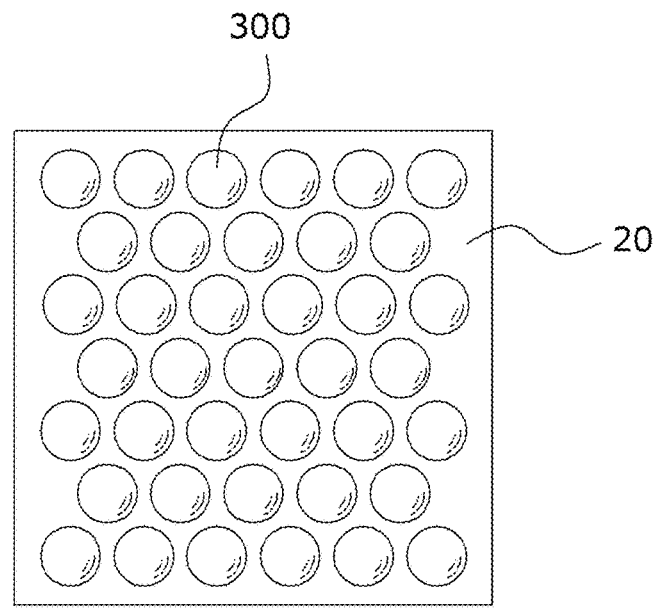
FIGS. 15 to 18 are mimetic views showing a method for controlling the size of the polystyrene spheres, which are attached to a substrate during the formation of the rear electrode pattern according to the embodiment of the present invention, thereby controlling the shape of the rear electrode pattern.
Figure 17:
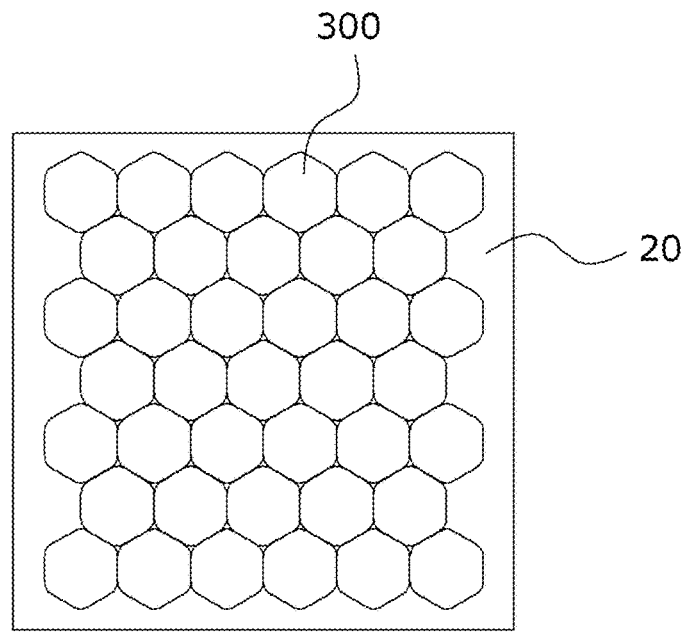

FIGS. 15 and 17 show that polystyrene spheres 300 having the same size as those of FIG. 11 are attached, after which the size of the polystyrene spheres 300 is changed.

Figure 16:
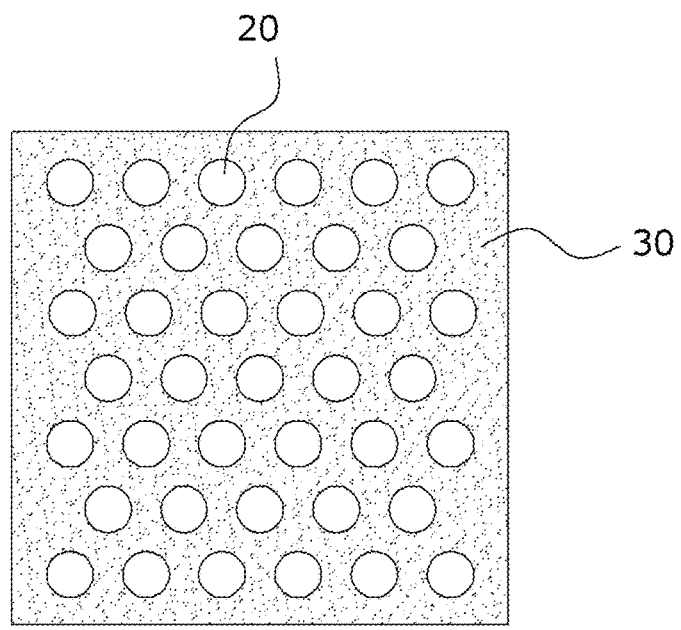

FIG. 15 shows that the polystyrene spheres 300 are attached as in FIG. 11, after which the diameter of the polystyrene spheres 300 is reduced using a liquid for etching the surface of the polystyrene sphere 300. Therefore, as shown in FIG. 16, the size of the transmissive portion, which is positioned between the rear electrode patterns 30 and through which the rear electrode layer 20 is exposed, is reduced, and the width of the rear electrode pattern 30 is increased.

Figure 18:
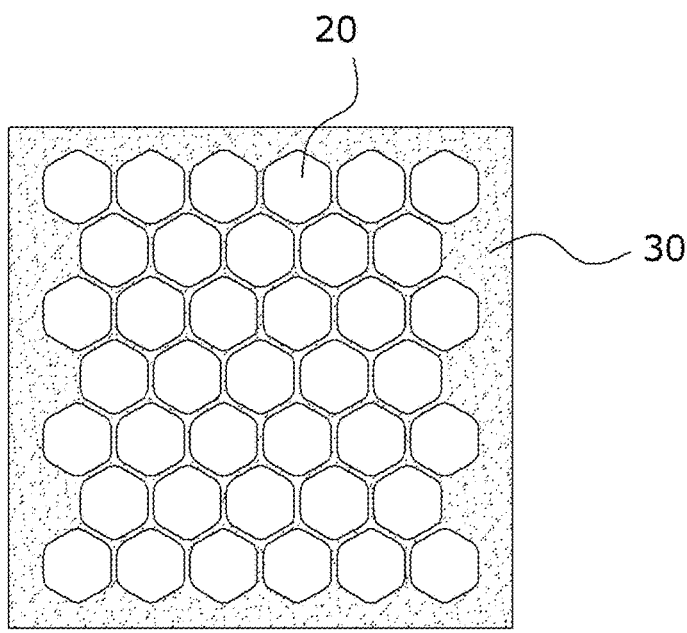

On the other hand, as shown in FIG. 17, after the polystyrene spheres 300 are attached as shown in FIG. 11, a liquid, such as an organic solvent, for sticking the polystyrene spheres 300 together is used to thus achieve high densification, thereby increasing the area occupied by the polystyrene spheres per unit area of the substrate 400. As shown in FIG. 11, since the polystyrene spheres 300 are attached and arranged close together, the polystyrene spheres 300 are stuck together to thus reduce the space between the polystyrene spheres. In FIG. 18, the area occupied by the transmissive portions, which are positioned between the rear electrode patterns 30 and through which the rear electrode layer 20 is exposed, is increased, and the width of the rear electrode pattern 30 is reduced.

Figure 19:
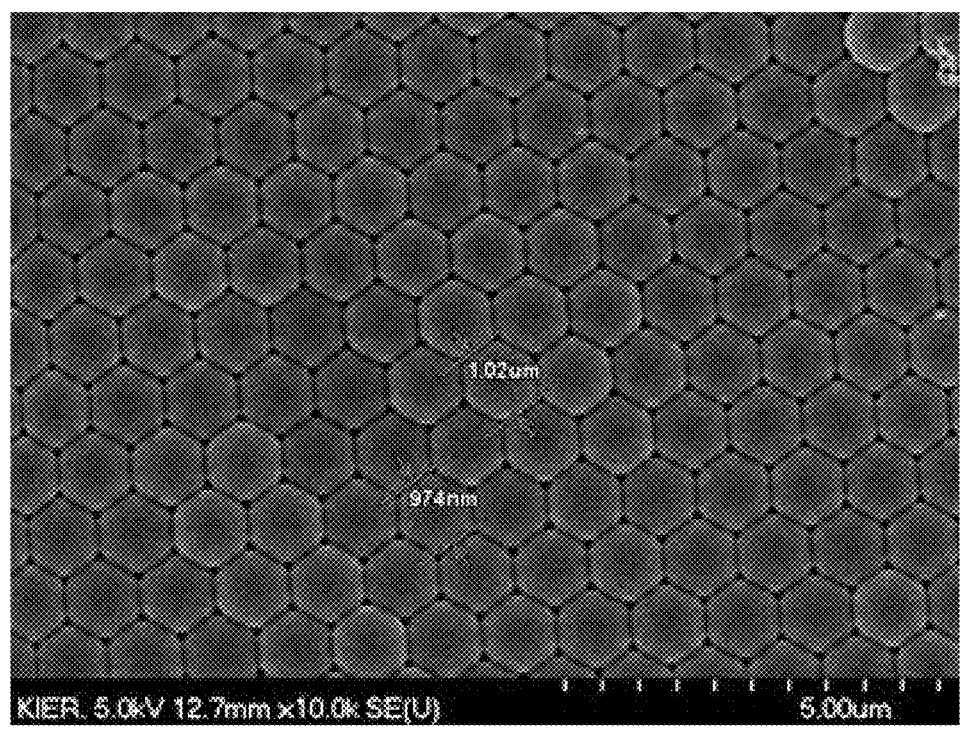
FIG. 19 is an electron micrograph showing the highly densified polystyrene spheres in an attached state.

FIG. 19 is an electron micrograph showing the highly densified polystyrene spheres in an attached state.

As shown in FIG. 19, after the polystyrene spheres having an average diameter of 1 μm are attached and then immersed in acetone for 5 min to stick together, the space between the polystyrene spheres, which have a circular section, is reduced to thus change the sectional shape of the polystyrene sphere into a hexagon, thereby achieving high densification.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a CIGS-based solar cell, the method comprising:
    forming a rear electrode layer including a transparent oxide material;
    forming rear electrode patterns including a metal material on the rear electrode layer;
    forming a CIGS-based light absorption layer on the rear electrode layer on which the rear electrode patterns are formed;
    forming a buffer layer on the light absorption layer; and
    forming a front electrode including a transparent material on the buffer layer,
    wherein the rear electrode patterns are provided with a transmissive portion, through which light is transmitted, formed between patterns of the metal material,
    wherein the forming the rear electrode patterns includes:
    attaching spherical particles to a surface of the rear electrode layer so that the spherical particles are arranged close together;
    immerging the spherical particles attached to the surface of the rear electrode layer in an organic solvent to increase an area occupied by the spherical particles per unit area of the rear electrode layer;
    depositing the metal material on a space between the spherical particles which are arranged close together; and
    removing the spherical particles to form the transmissive portion.

2. The method of claim 1, wherein the rear electrode patterns are size controlled by controlling the size of the spherical particles.

3. The method of claim 1, wherein the spherical particles includes a polystyrene material.

4. The method of claim 3, wherein the organic solvent is acetone.

* * * * *